(12) United States Patent
Weng

(10) Patent No.: US 12,089,469 B2
(45) Date of Patent: Sep. 10, 2024

(54) DISPLAY PANEL AND MANUFACTURING METHOD OF DISPLAY PANEL

(71) Applicants: Wuhan China Star Optoelectronics Technology Co., Ltd., Hubei (CN); Wuhan China Star Optoelectronics Semiconductor Display Technology Co., Ltd., Hubei (CN)

(72) Inventor: Dezhi Weng, Wuhan (CN)

(73) Assignees: Wuhan China Star Optoelectronics Technology Co., Ltd., Hubei (CN); Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 0 days.

(21) Appl. No.: 17/608,143

(22) PCT Filed: Aug. 16, 2021

(86) PCT No.: PCT/CN2021/112718
§ 371 (c)(1),
(2) Date: Nov. 1, 2021

(87) PCT Pub. No.: WO2022/267201
PCT Pub. Date: Dec. 29, 2022

(65) Prior Publication Data
US 2024/0023403 A1     Jan. 18, 2024

(30) Foreign Application Priority Data
Jun. 23, 2021   (CN) .......................... 202110696524.9

(51) Int. Cl.
| H01L 27/32 | (2006.01) |
| H10K 59/38 | (2023.01) |
| H10K 59/80 | (2023.01) |

(52) U.S. Cl.
CPC .......... *H10K 59/38* (2023.02); *H10K 59/873* (2023.02); *H10K 59/8791* (2023.02)

(58) Field of Classification Search
CPC .. H10K 59/38; H10K 59/873; H10K 59/8791; H10K 50/858; H10K 50/86;
(Continued)

(56) References Cited

U.S. PATENT DOCUMENTS

2012/0119239 A1    5/2012   Kim et al.

FOREIGN PATENT DOCUMENTS

| CN | 103943662 A | 7/2014 |
| CN | 107331688 A | 11/2017 |

(Continued)

OTHER PUBLICATIONS

Chinese Office Action in corresponding Chinese Patent Application No. 202110696524.9 dated May 31, 2022, pp. 1-8.

(Continued)

*Primary Examiner* — Elmito Breval
(74) *Attorney, Agent, or Firm* — PV IP PC; Wei Te Chung

(57) ABSTRACT

A display panel and a manufacturing method of the display panel are provided. The display panel has a light emitting layer, an encapsulation layer provided on the light emitting layer, a color filter layer provided on the encapsulation layer and a light transmitting layer provided on the color filter layer, and the color filter layer has color resistors and a light shielding member located among the color resistors, and a thickness d of the color resistors and a refractive index n thereof satisfy a specific relationship.

20 Claims, 1 Drawing Sheet

(58) Field of Classification Search
CPC .. H10K 50/865; H10K 59/12; H10K 59/1201; H10K 71/00; H10K 50/844
See application file for complete search history.

(56) References Cited

FOREIGN PATENT DOCUMENTS

| | | |
|---|---|---|
| CN | 107589584 A | 1/2018 |
| CN | 109407870 A | 3/2019 |
| CN | 109979975 A | 7/2019 |
| CN | 110010642 A | 7/2019 |
| CN | 110703941 A | 1/2020 |
| CN | 110992850 A | 4/2020 |
| CN | 111162110 A | 5/2020 |
| CN | 112420956 A | 2/2021 |
| CN | 112612373 A | 4/2021 |
| CN | 112786666 A | 5/2021 |
| JP | H0915420 A | 1/1997 |

OTHER PUBLICATIONS

International Search Report in International application No. PCT/CN2021/112718, mailed on Feb. 25, 2022.
Written Opinion of the International Searching Authority in International application No. PCT/CN2021/112718, mailed on Feb. 25, 2022.

DISPLAY PANEL AND MANUFACTURING METHOD OF DISPLAY PANEL

CROSS REFERENCE

This application claims the priority of Chinese Patent Application No. 202110696524.9, entitled "Display panel and manufacturing method of display panel", filed on Jun. 23, 2021 of which is incorporated hereby incorporated in its entirety by reference.

FIELD OF INVENTION

The present application relates to the field of display technologies, and more particularly to a display panel and a manufacturing method of the display panel.

BACKGROUND OF INVENTION

Polarizer (POL) can effectively reduce the reflectivity of the panel under strong light, but it loses close to 58% of the light output. For organic light emitting diode (OLED) display panels, it greatly increases the light emitting loading of the diode, resulting in a reduction in its life span; on the other hand, the thickness of the polarizer is large and the material is brittle, which is not conducive to the development of dynamic bending products. Therefore, in order to develop dynamic bending products based on OLED display technology, new materials, new technologies and new processes must be introduced to replace polarizers.

At present, the use of color filters to replace polarizers is classified as non-polarizer technology (POL-less). It cannot only reduce the thickness of the polarizing function layer from close to 100 microns to less than 5 microns, but also reduce the thickness of the display panel. Meanwhile, the light extraction rate has been increased from 42% to 60%. The POL-less technology based on color filter is considered to be one of the key technologies to realize the development of dynamic bending products. Although the use of color filter to replace polarizers has many of the aforesaid advantages, it will increase the overall reflectivity of the display panel, making the reflectance of more than 6%, and then reducing the display contrast of the display panel.

The current display panel based on the non-polarizer technology has a technical problem of high reflectivity.

SUMMARY OF INVENTION

The present application provides a display panel and a manufacturing method of the display panel, which are employed to alleviate the technical problem of high reflectivity of the current display panel based on the non-polarizer technology.

The present application provides a display panel, including:
 a light emitting layer;
 an encapsulation layer, disposed on a light emitting surface of the light emitting layer;
 a color filter layer, disposed on the encapsulation layer, the color filter layer comprises a plurality of color resistors and a light shielding member located among the color resistors, and a refractive index of the color resistors is n;
 a light transmitting layer, disposed on the color filter layer and located on a side of the color filter layer away from the encapsulation layer;
 a thickness d of the color resistors and the refractive index n of the color resistors satisfy following relationship:

$$d = \frac{(2K+1)\lambda}{4n};$$

wherein K is a constant, and λ is a wavelength of light corresponding to a color of the color resistor.

In the display panel of the present application, the color resistors comprises a red color resistor, a refractive index of the red resistor is n1, and a thickness of the red resistor is d1;
 the thickness d1 of the red resistor and the refractive index n1 of the red resistor satisfy following relationship:

$$d_1 = \frac{(2K+1)\lambda_1}{4n_1};$$

wherein λ1 is the wavelength of red light.

In the display panel of the present application, the refractive index n1 of the red resistor is 1.52.

In the display panel of the present application, the color resistors comprises a green resistor, a refractive index of the green resistor is n2, and a thickness of the green resistor is d2;
 the thickness d2 of the green resistor and the refractive index n2 of the green resistor satisfy following relationship:

$$d_2 = \frac{(2K+1)\lambda_2}{4n_2}$$

wherein λ2 is the wavelength of green light.

In the display panel of the present application, the refractive index n2 of the green resistor is 1.52.

In the display panel of the present application, the green resistor comprises a mixture of acetic acid-2-(2-butoxyethoxy) ethyl (alcohol) ester and exposure resin.

In the display panel of the present application, the color resistors comprises a blue resistor, a refractive index of the blue resistor is n3, and a thickness of the blue resistor is d3;
 the thickness d3 of the blue resistor and the refractive index n3 of the blue resistor satisfy following relationship:

$$d_3 = \frac{(2K+1)\lambda_3}{4n_3}$$

wherein λ3 is the wavelength of blue light.

In the display panel of the present application, the refractive index n3 of the blue resistor is 1.52.

In the display panel of the present application, a size of the color resistors on a side close to the light transmitting layer is greater than a size of the color resistors on a side close to the encapsulation layer.

In the display panel of the present application, the size of the color resistors gradually decreases from the side close to the light transmitting layer to the side close to the encapsulation layer.

In the display panel of the present application, the encapsulation layer comprises a first encapsulation layer close to the color resistors, a refractive index of the first encapsulation layer is n4, and a refractive index of the light transmitting layer is n5;

the refractive index n of the color resistors, the refractive index n4 of the first encapsulation layer and the refractive index n5 of the light transmitting layer satisfy the following relationship:

$$n^2 = n_4 \cdot n_5$$

In the display panel of the present application, the encapsulation layer further comprises: a third encapsulation layer disposed on the light emitting layer, a second encapsulation layer disposed on the third encapsulation layer and the first encapsulation layer is disposed on the second encapsulation layer.

In the display panel of the present application, the first encapsulation layer and the third encapsulation layer comprise an inorganic encapsulation layer, and the second encapsulation layer comprises an organic encapsulation layer.

In the display panel of the present application, the light emitting layer comprises a plurality of light emitting units, and the color resistors and the light emitting units are arranged in a one-to-one correspondence.

The present application further provides a manufacturing method of a display panel, comprising:
preparing a light emitting layer;
preparing an encapsulation layer on a light emitting surface of the light emitting layer;
preparing a color filter layer, comprising a plurality of color resistors and a light shielding member located among the color resistors on the encapsulation layer, that a thickness d of the color resistors and a refractive index n of the color resistors satisfy:

$$d = \frac{(2K+1)\lambda}{4n},$$

wherein K is a constant, and λ is a wavelength of light corresponding to a color of the color resistor;
preparing a light transmitting layer on the color filter layer.

In the manufacturing method of the display panel of the present application, the step of preparing the color filter layer, comprising the plurality of color resistors and the light shielding member located among the color resistors on the encapsulation layer further comprises:
preparing an original light shielding layer on the encapsulation layer;
fabricating a plurality of openings on the original light shielding layer to form the light shielding member;
preparing color resistors in the openings, that the thickness d of the color resistors satisfies:

$$d = \frac{(2K+1)\lambda}{4n}.$$

In the manufacturing method of the display panel of the present application, the plurality of color resistors comprise red resistors, green resistors, and blue resistors, and the step of preparing the color resistors in the openings further comprises:
preparing the red resistors in a portion of the openings, that a thickness d1 of the red resistors and a refractive index n1 of the red resistors satisfy:

$$d_1 = \frac{(2K+1)\lambda_1}{4n_1},$$

wherein λ1 is the wavelength of red light;
preparing the green resistors in a portion of the openings, that a thickness d2 of the green resistors and a refractive index n2 of the green resistors satisfy:

$$d_2 = \frac{(2K+1)\lambda_2}{4n_2},$$

wherein λ2 is the wavelength of green light;
preparing the blue resistors in a portion of the openings, that a thickness d3 of the blue resistors and a refractive index n3 of the blue resistors satisfy:

$$d_3 = \frac{(2K+1)\lambda_3}{4n_3},$$

wherein λ3 is the wavelength of blue light.

In the manufacturing method of the display panel of the present application, the encapsulation layer comprises: a third encapsulation layer disposed on the light emitting layer, a second encapsulation layer disposed on the third encapsulation layer, and a first encapsulation layer disposed on the second encapsulation layer.

In the manufacturing method of the display panel of the present application, a refractive index of the first encapsulation layer is n4, and a refractive index of the light transmitting layer is n5;
the refractive index n of the color resistors, the refractive index n4 of the first encapsulation layer and the refractive index n5 of the light transmitting layer satisfy the following relationship:

$$n^2 = n_4 \cdot n_5$$

The present application further provides a display panel, including:
a light emitting layer;
an encapsulation layer, disposed on a light emitting surface of the light emitting layer;
a color filter layer, disposed on the encapsulation layer, the color filter layer comprises a plurality of color resistors and a light shielding member located among the color resistors, the color resistors comprise red resistors, green resistors, and blue resistors, and a refractive index of the red resistors is n1, a refractive index of the green resistor is n2, and a refractive index of the blue resistor is n3;
a light transmitting layer, disposed on the color filter layer and located on a side of the color filter layer away from the encapsulation layer;
the thickness d1 of the red resistor and the refractive index n1 of the red resistor satisfy following relationship:

$$d_1 = \frac{(2K+1)\lambda_1}{4n_1},$$

wherein K is a constant, and λ1 is the wavelength of red light;

the thickness d2 of the green resistor and the refractive index n2 of the green resistor satisfy following relationship:

$$d_2 = \frac{(2K+1)\lambda_2}{4n_2},$$

wherein K is a constant, and λ2 is the wavelength of green light;

the thickness d3 of the blue resistor and the refractive index n3 of the blue resistor satisfy following relationship:

$$d_3 = \frac{(2K+1)\lambda_3}{4n_3},$$

wherein K is a constant, and λ3 is the wavelength of blue light.

A display panel and a manufacturing method of the display panel are provided. The display panel has a light emitting layer, an encapsulation layer provided on the light emitting layer, a color filter layer provided on the encapsulation layer and a light transmitting layer provided on the color filter layer, and the color filter layer has color resistors and a light shielding member located among the color resistors, and a thickness d of the color resistors and a refractive index n thereof satisfy:

$$d = \frac{(2K+1)\lambda}{4n},$$

wherein K is a constant, and λ is a wavelength of light corresponding to a color of the color resistor. In the present application, the thickness of the color resistors is designed according to the refractive index of the color resistor, so that as light passes through the color resistors, the reflected light emitted from the upper and lower interfaces of the color resistors will have destructive interference, thereby reducing the amount of reflected light emitted from the surfaces of the color resistors, thereby reducing the reflectivity of the display panel and improving the display contrast thereof.

BRIEF DESCRIPTION OF THE DRAWINGS

In order to more clearly illustrate the embodiments of the present application and the prior art, the following figures will be described in the embodiments and the prior art are briefly introduced. It is obvious that the drawings are only some embodiments of the present application, those of ordinary skill in this field can obtain other figures according to these figures without paying the premise.

DETAILED DESCRIPTION OF PREFERRED EMBODIMENTS

Figure 1:
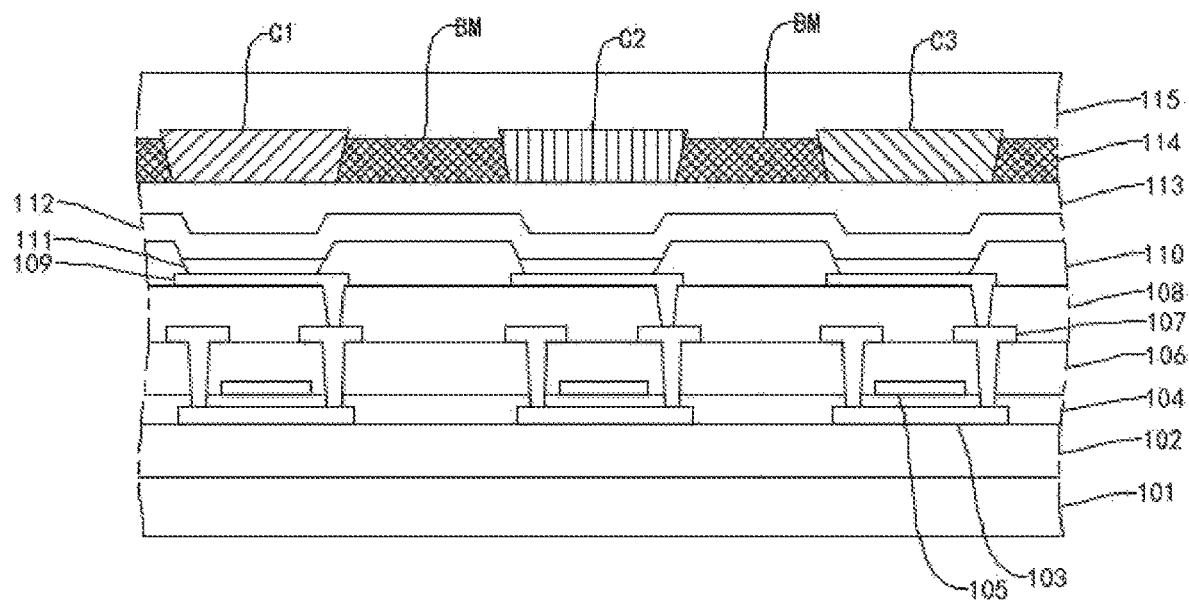
FIG. 1 is a structure diagram of a display panel provided by an embodiment of the present application.

The following descriptions for the respective embodiments are specific embodiments capable of being implemented for illustrations of the present application with referring to appended figures. The terms of up, down, front, rear, left, right, interior, exterior, side, etcetera mentioned in the present application are merely directions of referring to appended figures. Thus, the used directional terms are used to describe and understand the present application, but the present invention is not limited thereto. In the figure, units with similar structures are denoted by the same reference numerals.

The embodiment of the present application provides a display panel and a manufacturing method of the display panel. The display panel comprises a light emitting layer, an encapsulation layer arranged on the light emitting layer, a color filter layer arranged on the encapsulation layer and a light transmitting layer arranged on the color filter layer, and the color filter layer comprises color resistors and a light shielding member located among the color resistors, and a thickness d of the color resistors and a refractive index n thereof satisfy:

$$d = \frac{(2K+1)\lambda}{4n},$$

wherein K is a constant, and λ is a wavelength of light corresponding to a color of the color resistor.

In the embodiment of the present application, the thickness of the color resistors is designed according to the refractive index of the color resistor, so that as light passes through the color resistors, the reflected light emitted from the upper and lower interfaces of the color resistors will have destructive interference, thereby reducing the amount of reflected light emitted from the surfaces of the color resistors, thereby reducing the reflectivity of the display panel and improving the display contrast thereof.

The structural features of the display panel provided by the present application will be described in detail below with reference to specific embodiments.

Figure 2:
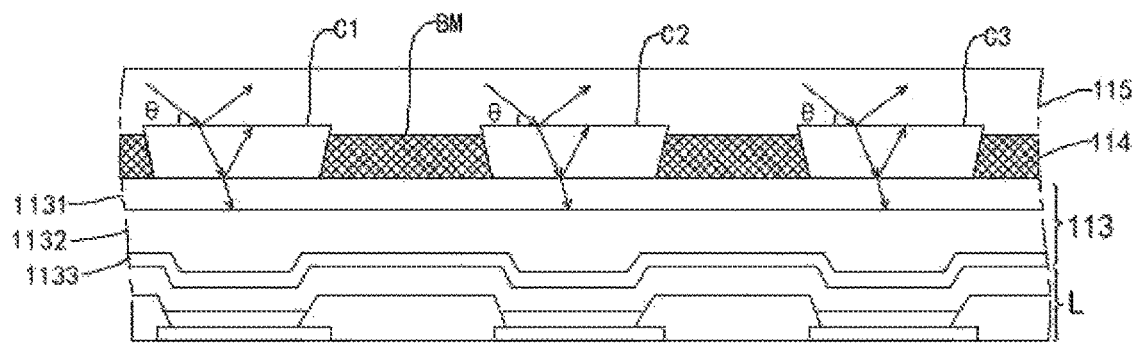
FIG. 2 is a partial structure diagram of a light emitting layer and a film layer above the light emitting layer of the display panel shown in FIG. 1.

Referring to FIG. 1 and FIG. 2, FIG. 1 is a structure diagram of a display panel provided by an embodiment of the present application. FIG. 2 is a partial structure diagram of a light emitting layer and a film layer above the light emitting layer of the display panel shown in FIG. 1.

In one embodiment, the display panel comprises: a light emitting layer L, an encapsulation layer 113 disposed on a light emitting surface of the light emitting layer L, a color filter layer 114 disposed on the encapsulation layer 113, and a light transmitting layer 115 disposed on the color filter layer 114. The encapsulation layer 113 and the light transmitting layer 115 are respectively disposed on opposite sides of the color filter layer 114.

The light emitting layer L is arranged with a plurality of light emitting units, and light emitted by the light emitting units sequentially passes through the encapsulation layer 113, the color filter layer 114 and the light-transmitting layer 115 to exit the display panel.

Preferably, the encapsulation layer 113 allows light transmission. The encapsulation layer 113 comprises: a third encapsulation layer 1133 disposed on the light emitting layer L, a second encapsulation layer 1132 disposed on the third encapsulation layer 1133 and a first encapsulation layer 1131 disposed on the second encapsulation layer 1132. The color filter layer 114 is disposed on the first encapsulation layer 1131. The first encapsulation layer 1131 and the third encapsulation layer 1133 are inorganic encapsulation layers, which can be fabricated by a chemical vapor deposition process, and for example, can be silicon nitride film layers deposited by a chemical vapor deposition process. The second encapsulation layer 1132 is an organic encapsulation layer, which can be fabricated by coating or other processes.

A plurality of color resistors are arranged in the color filter layer 114, and a light shielding member BM is arranged among the adjacent color resistors; the color resistors only allows light of specific wavelengths to pass through, for example, light within a specific wavelength range emitted by the light emitting units can pass through the color resistors. The light shielding member BM does not allow light transmission, and neither the light emitted by the light emitting units nor the natural light from the outside can pass through the light shielding member BM.

Preferably, according to the different wavelengths of light that the color resistors allow to pass through, the color resistors can be divided into a red resistor C1, a green resistor C2 and a blue resistor C3, and the light in the red wavelength range only can pass through the red resistor C1, the light in the green wavelength range only can pass through the green resistor C2, and the light in the blue wavelength range only can pass through the blue resistor C3.

Correspondingly, the light emitting units in the light emitting layer L also comprise a red light emitting unit, a green light emitting unit and a blue light emitting unit. The red light emitting unit is arranged vertically corresponding to the red resistor C1, and the light emitted by the red light emitting unit passes through the red resistor C1 and exits the display panel; the green light emitting unit is arranged vertically corresponding to the green resistor C2, and the light emitted by the green light emitting unit passes through the green resistor C2 and exits the display panel; the blue light emitting unit is arranged vertically corresponding to the blue resistor C3, and the light emitted by the blue light emitting unit is emitted out of the display panel through the blue resistor C3.

Furthermore, since the color resistors allow light transmission, it has a refractive index n, in this embodiment, a thickness d of the color resistors and the refractive index n of the color resistors satisfy following relationship:

$$d = \frac{(2K+1)\lambda}{4n};$$

wherein $\lambda$ is the wavelength of light corresponding to the color of the color resistor, K is a constant determined according to the production process, and in the embodiment of the present application, considering the color resistor fabricating process and the fabricating process of other corresponding structures in the panel, the value of K can be selected as 8.

In order to reduce the amount of reflection of the external natural light on the upper and lower interfaces of the color resistor, this embodiment considers a solution in which the reflected light generated by the upper and lower interfaces of the color resistor will have destructive interference. The condition for the destructive interference of the reflected light from the upper and lower interfaces of the color resistor is that the thickness d of the color resistor and the refractive index n of the color resistor need to satisfy the following interference equation:

$$2nd = (K + \tfrac{1}{2})\lambda;$$

wherein K is a constant, and $\lambda$ is a wavelength of light corresponding to a color of the color resistor.

In this embodiment, the thickness d of the color resist is set to:

$$d = \frac{(2K+1)\lambda}{4n},$$

bringing the thickness value into the aforementioned interference equation can realize that the equation holds, that is, the color resistor in the display panel provided by the embodiment of the present application can realize the destructive interference of the reflected light generated by the upper and lower interfaces of the color resistor, thereby reducing the amount of reflected light emitted from the surfaces of the color resistors, thereby reducing the reflectivity of the display panel and improving the display contrast thereof.

Furthermore, in the display panel provided by the embodiment of the present application, the upper and lower film layers in contact with the color resistors are: the first encapsulation layer 1131 and the light transmitting layer 115, respectively. The transmission path of external light is: from the light transmitting layer 115 to the color resistor, and then to the first encapsulation layer 1131. The refractive index of the first encapsulation layer is n4, the refractive index of the light transmitting layer is n5, the incident angle of external light to the color resistor is $\theta$, the reflectivity of external light at the interface between the color resistor and the light transmitting layer 115 is R1, and the reflectivity at the interface between the color resistor and the first encapsulation layer 1131 is R2, and the total reflectivity of external light for the foregoing two interfaces is R, and then the following equation relationships exist:

$$R = \frac{R_1^2 + R_2^2 + 2R_1 R_2 \cos 2\theta}{1 + R_1^2 + R_2^2 + 2R_1 R_2 \cos 2\theta};$$

$$R_1 = \frac{n_5 - n}{n_5 + n};$$

$$R_2 = \frac{n - n_4}{n + n_4};$$

$$\theta = \frac{2\pi n d}{\lambda};$$

combining the equation:

$$d = \frac{(2K+1)\lambda}{4n}$$

with the above equations, it can be obtained that the minimum reflectivity Rmin of the color resistor in the display panel provided by this embodiment is:

$$R_{min} = \left(\frac{n^2 - n_4 n_5}{n^2 + n_4 n_5}\right)^2.$$

Further, in this embodiment, the refractive index of the red resistor C1 is n1, and the thickness of the red resistor C1 is d1; the thickness d1 of the red resistor and the refractive index n1 of the red resistor satisfy following relationship:

$$d_1 = \frac{(2K+1)\lambda_1}{4n_1};$$

wherein λ1 is the wavelength of red light, and the refractive index n1 of the red resistor C1 is 1.52, and according to these data and the above equation relationships, it can be obtained that the minimum reflectivity Rmin of the red resistor C1 provided by this embodiment to light is about 0.5%.

Further, in this embodiment, the refractive index of the green resistor C2 is n2, and the thickness of the green resistor C2 is d2; the thickness d2 of the green resistor and the refractive index n2 of the green resistor satisfy following relationship:

$$d_2 = \frac{(2K+1)\lambda_2}{4n_2};$$

wherein λ2 is the wavelength of green light.

Preferably, the green resistor C2 comprises a mixture of acetic acid-2-(2-butoxyethoxy) ethyl (alcohol) ester and exposure resin, and the refractive index n2 thereof is 1.52, the wavelength range of green light is 500 nanometers to 560 nanometers, and according to these data and the above equation relationships, it can be obtained that the thickness d2 of the green resistor C2 provided in this embodiment is about 1.5 microns, and the minimum reflectivity Rmin of the green resistor C2 to light is about 0.8%.

Further, in this embodiment, the refractive index of the blue resistor C3 is n3, and the thickness of the blue resistor C3 is d3; the thickness d3 of the blue resistor and the refractive index n3 of the blue resistor satisfy following relationship:

$$d_3 = \frac{(2K+1)\lambda_3}{4n_3};$$

wherein λ3 is the wavelength of blue light, and the refractive index n3 of the blue resistor C3 is 1.52, and according to these data and the above equation relationships, it can be obtained that the minimum reflectivity Rmin of the blue resistor C3 provided by this embodiment to light is about 0.5%.

Based on the above-mentioned minimum reflectivity of each color resistor to light, the overall reflectivity of the display panel provided by the embodiment of the present application is reduced to about 5% after calculation. Compared with the case where the overall reflectivity of the display panel is above 6% in the ordinary design, the display panel provided by the present application reduces the reflectivity, which is beneficial to improve the display contrast.

In one embodiment, the refractive index n of the color resistor, the refractive index n4 of the first encapsulation layer 1131 and the refractive index n5 of the light transmitting layer 115 satisfy the following relationship:

$$n^2 = n_4 \cdot n_5;$$

according to the minimum reflectivity Rmin of the color resistor in the display panel is:

$$R_{min} = \left(\frac{n^2 - n_4 n_5}{n^2 + n_4 n_5}\right)^2,$$

it can be known that as $n^2 = n_4 \cdot n_5$, the minimum reflectivity Rmin of the color resistor reaches the minimum value, which is 0, so that the reflectivity of the display panel is further reduced.

Furthermore for convenience of fabricating the color resistors, in this embodiment, a size of the color resistors on a side close to the light transmitting layer 115 is set to be greater than a size of the color resistors on a side close to the encapsulation layer 1131.

Further, the display panel provided by this embodiment further comprises: a base substrate 101, a buffer layer 102 disposed on the base substrate 101, a semiconductor layer 103 disposed on the buffer layer 102, a gate insulating layer 104 covering the semiconductor layer 103, a gate electrode 105 disposed on the gate insulating layer 104, an interlayer insulating layer 106 covering the gate electrode 105, a source and drain electrodes 107 disposed on the interlayer insulating layer 106 and a planarization layer 108 covering the source and drain electrodes 107. The light emitting layer L is disposed on the planarization layer 108.

The base substrate 101 may be a composite structure composed of a first polyimide layer, an intermediate buffer layer and a second polyimide layer. The source and drain electrodes 107 are connected to opposite ends of the semiconductor layer 103 through via holes in the gate insulating layer 104 and the interlayer insulating layer 106, and the semiconductor layer 103, the gate electrode 105 and the source and drain electrodes 107 constitute a thin film transistor device.

Further, the light emitting layer L comprises: an anode 109 disposed on the planarization layer 108, a pixel defining layer 110 being disposed on the planarization layer 108 and having an opening corresponding to the anode 109, a light emitting function layer disposed in the opening of the pixel defining layer 110 111 and a cathode 112 disposed on the light emitting function layer 111 and the pixel defining layer 110. The anode 109 is electrically connected to the source and drain electrodes 107 through the via holes in the planarization layer 108 and receives the driving signal transmitted by the source and drain electrodes 107. The light emitting function layer 111 comprises a hole injection layer, a hole transport layer, an organic light emitting layer, an electron transport layer and an electron injection layer, in order to realize the injection of the holes generated by the anode 109 and the injection of the electrons generated by the cathode 112, and the holes and the electrons are combined to emit light in the organic light emitting layer. The light emitting function layer 111, and the anode 109 and the cathode 112 connected thereto together constitute the light emitting unit. The encapsulation layer 113 is disposed on the cathode 112.

In conclusion, the display panel provided by the embodiment of the present application comprises a light emitting layer, an encapsulation layer arranged on the light emitting layer, a color filter layer arranged on the encapsulation layer and a light transmitting layer arranged on the color filter layer, and the color filter layer comprises color resistors and a light shielding member located among the color resistors, and a thickness d of the color resistors and a refractive index n thereof satisfy $$d = \frac{(2K+1)\lambda}{4n},$$

wherein K is a constant, and λ is a wavelength of light corresponding to a color of the color resistor. In the embodiment of the present application, the thickness of the color resistors is designed according to the refractive index of the color resistor, so that as light passes through the color resistors, the reflected light emitted from the upper and lower interfaces of the color resistors will have destructive interference, thereby reducing the amount of reflected light emitted from the surfaces of the color resistors, thereby reducing the reflectivity of the display panel and improving the display contrast thereof.

The embodiment of the present application further provides a manufacturing method of the display panel, which can be employed to manufacture the display panel shown in FIG. 1. Please refer to FIG. 1 and FIG. 2.

The manufacturing method of the display panel, comprising steps of:

Step S101, preparing a light emitting layer L.

Preferably, before the step of fabricating the light emitting layer L, the manufacturing method of the display panel may further comprises steps of fabricating the following film layers of the display panel: a buffer layer 102 disposed on the base substrate 101, a semiconductor layer 103 disposed on the buffer layer 102, a gate insulating layer 104 covering the semiconductor layer 103, a gate electrode 105 disposed on the gate insulating layer 104, an interlayer insulating layer 106 covering the gate electrode 105, a source and drain electrodes 107 disposed on the interlayer insulating layer 106 and a planarization layer 108 covering the source and drain electrodes 107.

Further, Step S101 comprises: fabricating an anode 109 on the planarization layer 108; fabricating a pixel defining layer 110 having an opening corresponding to the anode 109 on the planarization layer 108, fabricating a light emitting function layer 111 in the opening of the pixel defining layer 110, and fabricating a cathode 112 on the light emitting function layer 111 and the pixel defining layer 110. The anode 109 is electrically connected to the source and drain electrodes 107 through the via holes in the planarization layer 108. The light emitting function layer 111 comprises a hole injection layer, a hole transport layer, an organic light emitting layer, an electron transport layer and an electron injection layer, in order to realize the injection of the holes generated by the anode 109 and the injection of the electrons generated by the cathode 112, and the holes and the electrons are combined to emit light in the organic light emitting layer.

Step S102, preparing an encapsulation layer 113 on a light emitting surface of the light emitting layer L.

The encapsulation layer 113 comprises: a third encapsulation layer 1133 disposed on the light emitting layer L, a second encapsulation layer 1132 disposed on the third encapsulation layer 1133 and a first encapsulation layer 1131 disposed on the second encapsulation layer 1132.

Preferably, the first encapsulation layer 1131 and the third encapsulation layer 1133 are inorganic encapsulation layers, which can be fabricated by a chemical vapor deposition process, for example, can be silicon nitride film layers deposited by a chemical vapor deposition process; the second encapsulation layer 1132 is an organic encapsulation layer, which can be fabricated by coating or other processes.

Step S103, preparing a color filter layer 114, comprising a plurality of color resistors and a light shielding member BM located among the color resistors on the encapsulation layer 113, that a thickness d of the color resistors and a refractive index n of the color resistors satisfy:

$$d = \frac{(2K+1)\lambda}{4n},$$

wherein K is a constant, and $\lambda$ is a wavelength of light corresponding to a color of the color resistor.

Specifically, Step S103 comprises: preparing an original light shielding layer on the encapsulation layer 113, the original light shielding layer is made of opaque material; fabricating a plurality of openings on the original light shielding layer to form the light shielding member BM; preparing color resistors in the openings, that the thickness d of the color resistors satisfies:

$$d = \frac{(2K+1)\lambda}{4n}.$$

In this embodiment, the thickness d of the color resist is set to:

$$d = \frac{(2K+1)\lambda}{4n},$$

bringing the thickness value into the aforementioned interference equation: $2nd=(K+\frac{1}{2})\lambda$, it can realize that the equation holds, that is, the color resistor fabricated in this embodiment of the present application can realize the destructive interference of the reflected light generated by the upper and lower interfaces of the color resistor, thereby reducing the amount of reflected light emitted from the surfaces of the color resistors, which is beneficial to reduce the reflectivity of the display panel.

According to the different wavelengths of light that the color resistors allow to pass through, the color resistors can be divided into a red resistor C1, a green resistor C2 and a blue resistor C3, and the red resistor C1 only allows light in the red wavelength range to pass through, the green resistor C2 only allows light in the green wavelength range to pass through, and the blue resistor C3 only allows light in the blue wavelength range to pass through.

Specifically, the step of preparing the color resistors comprises: preparing the red resistors C1 in a portion of the openings, that a thickness d1 of the red resistors C1 and a refractive index n1 of the red resistors C1 satisfy:

$$d_1 = \frac{(2K+1)\lambda_1}{4n_1},$$

wherein $\lambda 1$ is the wavelength of red light; preparing the green resistors C2 in a portion of the openings, that a thickness d2 of the green resistors C2 and a refractive index n2 of the green resistors C2 satisfy:

$$d_2 = \frac{(2K+1)\lambda_2}{4n_2},$$

wherein $\lambda 2$ is the wavelength of green light; preparing the blue resistors C3 in a portion of the openings, that a thickness d3 of the blue resistors C3 and a refractive index n3 of the blue resistors C3 satisfy:

$$d_3 = \frac{(2K+1)\lambda_3}{4n_3},$$

wherein $\lambda 3$ is the wavelength of blue light.

Step S104, preparing a light transmitting layer 115 on the color filter layer 114.

The refractive index of the first encapsulation layer is n4, the refractive index of the light transmitting layer is n5, the incident angle of external light to the color resistor is θ, the reflectivity of external light at the interface between the color resistor and the light transmitting layer 115 is R1, and the reflectivity at the interface between the color resistor and the first encapsulation layer 1131 is R2, and the total reflectivity of external light for the foregoing two interfaces is R, and then the following equation relationships exist:

$$R = \frac{R_1^2 + R_2^2 + 2R_1R_2\cos 2\theta}{1 + R_1^2 R_2^2 + 2R_1R_2\cos 2\theta};$$

$$R_1 = \frac{n_5 - n}{n_5 + n};$$

$$R_2 = \frac{n - n_4}{n + n_4};$$

$$\theta = \frac{2\pi n d}{\lambda};$$

combining the equation:

$$d = \frac{(2K+1)\lambda}{4n}$$

with the above equations, it can be obtained that the minimum reflectivity Rmin of the color resistor in the display panel manufactured by this embodiment is:

$$R_{min} = \left(\frac{n^2 - n_4 n_5}{n^2 + n_4 n_5}\right)^2.$$

In the case that the color resistors possess the minimum reflectivity, the overall reflectivity of the display panel manufactured by the embodiment of the present application is reduced to about 5% after calculation. Thus, this embodiment reduces the reflectivity of the manufactured display panel, which is beneficial to improve the display contrast.

Preferably, as selecting materials for fabricating the first encapsulation layer 1131, the color resistors and the light transmitting layer 115, the refractive index n of the color resistors, the refractive index n4 of the first encapsulation layer 1131 and the refractive index n5 of the light transmitting layer 115 can be selected to satisfy the following relationship:

$$n^2 = n_4 \cdot n_5;$$

according to the minimum reflectivity Rmin of the color resistor in the display panel is:

$$R_{min} = \left(\frac{n^2 - n_4 n_5}{n^2 + n_4 n_5}\right)^2,$$

it can be known that as $n^2 = n_4 \cdot n_5$, the minimum reflectivity Rmin of the color resistor reaches the minimum value, which is 0, so that the reflectivity of the manufactured display panel is further reduced.

In conclusion, in the manufacturing method of the display panel provided by the embodiment of the present application, the thickness of the color resistors is designed according to the refractive index of the color resistor, so that as light passes through the color resistors, the reflected light emitted from the upper and lower interfaces of the color resistors will have destructive interference, thereby reducing the amount of reflected light emitted from the surfaces of the color resistors, thereby reducing the reflectivity of the manufactured display panel and improving the display contrast thereof.

Specifically, although the above specific embodiments of the present application are disclosed, the foregoing specific embodiments are not intended to limit the invention, those skilled in the art can make various kinds of alterations and modifications without departing from the spirit and scope of the present application. Thus, the scope of protection of the present application is defined by the scope of the claims.

What is claimed is:

1. A display panel, comprising:
   a light emitting layer;
   an encapsulation layer, disposed on a light emitting surface of the light emitting layer;
   a color filter layer, disposed on the encapsulation layer, the color filter layer comprises a plurality of color resistors and a light shielding member located among the color resistors, and a refractive index of the color resistors is n;
   a light transmitting layer, disposed on the color filter layer and located on a side of the color filter layer away from the encapsulation layer;
   a thickness d of the color resistors and the refractive index n of the color resistors satisfy following relationship:

$$d = \frac{(2K+1)\lambda}{4n};$$

wherein K is a constant, and λ is a wavelength of light corresponding to a color of the color resistor.

2. The display panel according to claim 1, wherein the color resistors comprises a red color resistor, a refractive index of the red resistor is n1, and a thickness of the red resistor is d1;
   the thickness d1 of the red resistor and the refractive index n1 of the red resistor satisfy following relationship:

$$d_1 = \frac{(2K+1)\lambda_1}{4n_1};$$

wherein λ1 is the wavelength of red light.

3. The display panel according to claim 2, wherein the refractive index n1 of the red resistor is 1.52.

4. The display panel according to claim 1, wherein the color resistors comprises a green resistor, a refractive index of the green resistor is n2, and a thickness of the green resistor is d2;
   the thickness d2 of the green resistor and the refractive index n2 of the green resistor satisfy following relationship:

$$d_2 = \frac{(2K+1)\lambda_2}{4n_2};$$

wherein λ2 is the wavelength of green light.

5. The display panel according to claim 4, wherein the refractive index n2 of the green resistor is 1.52.

6. The display panel according to claim 4, wherein the green resistor comprises a mixture of acetic acid-2-(2-butoxyethoxy) ethyl (alcohol) ester and exposure resin.

7. The display panel according to claim 1, wherein the color resistors comprises a blue resistor, a refractive index of the blue resistor is n3, and a thickness of the blue resistor is d3;

the thickness d3 of the blue resistor and the refractive index n3 of the blue resistor satisfy following relationship:

$$d_3 = \frac{(2K+1)\lambda_3}{4n_3};$$

wherein λ3 is the wavelength of blue light.

8. The display panel according to claim 7, wherein the refractive index n3 of the blue resistor is 1.52.

9. The display panel according to claim 1, wherein a size of the color resistors on a side close to the light transmitting layer is greater than a size of the color resistors on a side close to the encapsulation layer.

10. The display panel according to claim 9, wherein the size of the color resistors gradually decreases from the side close to the light transmitting layer to the side close to the encapsulation layer.

11. The display panel according to claim 1, wherein the encapsulation layer comprises a first encapsulation layer close to the color resistors, a refractive index of the first encapsulation layer is n4, and a refractive index of the light transmitting layer is n5;

the refractive index n of the color resistors, the refractive index n4 of the first encapsulation layer and the refractive index n5 of the light transmitting layer satisfy the following relationship:

$$n_2 = n_4 \cdot n_5.$$

12. The display panel according to claim 11, wherein the encapsulation layer further comprises: a third encapsulation layer disposed on the light emitting layer, a second encapsulation layer disposed on the third encapsulation layer and the first encapsulation layer is disposed on the second encapsulation layer.

13. The display panel according to claim 12, wherein the first encapsulation layer and the third encapsulation layer comprise an inorganic encapsulation layer, and the second encapsulation layer comprises an organic encapsulation layer.

14. The display panel according to claim 1, wherein the light emitting layer comprises a plurality of light emitting units, and the color resistors and the light emitting units are arranged in a one-to-one correspondence.

15. A manufacturing method of a display panel, comprising:

preparing a light emitting layer;

preparing an encapsulation layer on a light emitting surface of the light emitting layer;

preparing a color filter layer, comprising a plurality of color resistors and a light shielding member located among the color resistors on the encapsulation layer, that a thickness d of the color resistors and a refractive index n of the color resistors satisfy:

$$d = \frac{(2K+1)\lambda}{4n},$$

wherein K is a constant, and λ is a wavelength of light corresponding to a color of the color resistor;

preparing a light transmitting layer on the color filter layer.

16. The manufacturing method of the display panel according to claim 15, wherein the step of preparing the color filter layer, comprising the plurality of color resistors and the light shielding member located among the color resistors on the encapsulation layer further comprises:

preparing an original light shielding layer on the encapsulation layer;

fabricating a plurality of openings on the original light shielding layer to form the light shielding member;

preparing color resistors in the openings, that the thickness d of the color resistors satisfies:

$$d = \frac{(2K+1)\lambda}{4n}.$$

17. The manufacturing method of the display panel according to claim 16, wherein the plurality of color resistors comprise red resistors, green resistors, and blue resistors, and the step of preparing the color resistors in the openings further comprises:

preparing the red resistors in a portion of the openings, that a thickness d1 of the red resistors and a refractive index n1 of the red resistors satisfy:

$$d_1 = \frac{(2K+1)\lambda_1}{4n_1},$$

wherein 2.1 is the wavelength of red light;

preparing the green resistors in a portion of the openings, that a thickness d2 of the green resistors and a refractive index n2 of the green resistors satisfy:

$$d_2 = \frac{(2K+1)\lambda_2}{4n_2},$$

wherein λ2 is the wavelength of green light;

preparing the blue resistors in a portion of the openings, that a thickness d3 of the blue resistors and a refractive index n3 of the blue resistors satisfy:

$$d_3 = \frac{(2K+1)\lambda_3}{4n_3},$$

wherein λ3 is the wavelength of blue light.

18. The manufacturing method of the display panel according to claim 15, wherein the encapsulation layer comprises: a third encapsulation layer disposed on the light emitting layer, a second encapsulation layer disposed on the third encapsulation layer, and a first encapsulation layer disposed on the second encapsulation layer.

19. The manufacturing method of the display panel according to claim 15, wherein a refractive index of the first encapsulation layer is n4, and a refractive index of the light transmitting layer is n5;

the refractive index n of the color resistors, the refractive index n4 of the first encapsulation layer and the refractive index n5 of the light transmitting layer satisfy the following relationship:

$$n^2 = n_4 \cdot n_5.$$

20. A display panel, including:

a light emitting layer;

an encapsulation layer, disposed on a light emitting surface of the light emitting layer;

a color filter layer, disposed on the encapsulation layer, the color filter layer comprises a plurality of color resistors and a light shielding member located among the color resistors, the color resistors comprise red resistors, green resistors, and blue resistors, and a refractive index of the red resistors is n1, a refractive index of the green resistor is n2, and a refractive index of the blue resistor is n3;

a light transmitting layer, disposed on the color filter layer and located on a side of the color filter layer away from the encapsulation layer;

the thickness d1 of the red resistor and the refractive index n1 of the red resistor satisfy following relationship:

$$d_1 = \frac{(2K+1)\lambda_1}{4n_1},$$

wherein K is a constant, and λ1 is the wavelength of red light;

the thickness d2 of the green resistor and the refractive index n2 of the green resistor satisfy following relationship:

$$d_2 = \frac{(2K+1)\lambda_2}{4n_2},$$

wherein K is a constant, and λ2 is the wavelength of green light;

the thickness d3 of the blue resistor and the refractive index n3 of the blue resistor satisfy following relationship:

$$d_3 = \frac{(2K+1)\lambda_3}{4n_3},$$

wherein K is a constant, and λ3 is the wavelength of blue light.

* * * * *